(12) United States Patent
Fiedler

(10) Patent No.: US 10,615,805 B2
(45) Date of Patent: Apr. 7, 2020

(54) OUTPUT DRIVER PULSE OVERLAP CONTROL

(71) Applicant: Microsoft Technology Licensing, LLC, Redmond, WA (US)

(72) Inventor: Alan Fiedler, Mountain View, CA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 129 days.

(21) Appl. No.: 15/485,068

(22) Filed: Apr. 11, 2017

(65) Prior Publication Data

US 2018/0226978 A1 Aug. 9, 2018

Related U.S. Application Data

(60) Provisional application No. 62/454,164, filed on Feb. 3, 2017.

(51) Int. Cl.
| | |
|---|---|
| G06F 1/04 | (2006.01) |
| H03K 5/135 | (2006.01) |
| H03L 7/081 | (2006.01) |
| H03L 7/089 | (2006.01) |
| H03L 7/093 | (2006.01) |
| H04L 7/033 | (2006.01) |
| G06F 1/06 | (2006.01) |

(52) U.S. Cl.
CPC .............. *H03L 7/0812* (2013.01); *G06F 1/06* (2013.01); *H03K 5/135* (2013.01); *H03L 7/0895* (2013.01); *H03L 7/093* (2013.01)

(58) Field of Classification Search
CPC ... H03L 7/0812; H03L 7/0891; H03L 7/0814; H03L 7/085
USPC ................................................ 327/156–158
See application file for complete search history.

(56) References Cited

U.S. PATENT DOCUMENTS

| | | | | |
|---|---|---|---|---|
| 5,926,041 A | * | 7/1999 | Duffy | ..................... G01R 25/00 327/12 |
| 9,407,273 B1 | | 8/2016 | Wei et al. | |

(Continued)

OTHER PUBLICATIONS

Jia, Cheng, "A Delay-Locked Loop for Multiple Clock Phases/Delays Generation", In Doctoral Dissertation of Georgia Institute of Technology, Dec. 2005, 94 pages.

*Primary Examiner* — Lincoln D Donovan
*Assistant Examiner* — Diana J. Cheng
(74) *Attorney, Agent, or Firm* — Alleman Hall Creasman & Tuttle LLP

(57) ABSTRACT

The control signal edges of pull-up and pull-down output transistors are aligned by a feedback system. The feedback system works to align the edges of these pull-up and pull-down control pulses while also reducing and/or minimizing any overlap of pull-up and pull-down control pulses. The feedback system uses a proportional feedback loop and an integral feedback loop. The proportional feedback loop controls the crossover voltages of the differential clock signals used to generate the pull-up and pull-down pulses. The integral feedback loop controls the crossover voltages of the differential clock signals output by the delay elements of a delay-locked loop. These crossover voltages are controlled by the feedback loops such that the edges of the pull-down control pulses are aligned to the edges of the pull-up control pulses (and vice versa) without creating excessive overlap.

19 Claims, 14 Drawing Sheets

(56) References Cited

U.S. PATENT DOCUMENTS

| | | |
|---|---|---|
| 9,525,573 B2 | 12/2016 | Fiedler |
| 2013/0002300 A1 | 1/2013 | Fiedler |
| 2013/0007500 A1 | 1/2013 | Fiedler |
| 2015/0130520 A1 | 5/2015 | Matsuda |
| 2016/0065196 A1 | 3/2016 | Fiedler |

* cited by examiner

OUTPUT DRIVER PULSE OVERLAP CONTROL

RELATED APPLICATIONS

This application claims the benefit of U.S. application Ser. No. 62/454,164, filed Feb. 3, 2017, the contents of which are incorporated herein by reference in its entirety for all purposes.

BACKGROUND

High-speed data serialization and transmission circuits may utilize push-pull type drivers that are controlled by high-speed pulses. Errors in the alignment of these pulses can lead to degraded timing, reduced output amplitude, increased crow-bar current, and increased power consumption.

SUMMARY

Examples discussed herein relate to a pulse generation and overlap control circuit that includes M clock- and data-controlled pullup-pulse (pu-pulse) generators controlled at least in part by N clock signals and N data signals. For reference, the pu-pulse generators can be numbered 1 to M. The circuit also includes M clock- and data-controlled pulldown-pulse (pd-pulse) generators controlled at least in part by the N clock signals and the N data signals. For reference, the pd-pulse generators can be numbered 1 to M. In an embodiment, M equals N/2 and each pu-pulse and pd-pulse generator includes a 2:1 multiplexer. The circuit also includes a pulse overlap measurement circuit that generates an overlap signal corresponding to an overlap between the pu-pulses and the pd-pulses. The circuit also includes a multi-phase clock generator that generates the N clock signals. The multiphase clock generator may include a delay-locked loop (DLL) or phase-locked loop (PLL). Each of the N clock signals has a respective phase. The circuit also includes a clock cross-over voltage control circuit that, based at least in part on the overlap signal, controls clock phase alignment thereby forming at least one feedback loop to control the overlap between the pu-pulses and pd-pulses. In one embodiment, the circuit is powered by supply voltages of zero volts and Vdd volts.

In an example, the multi-phase clock generator includes a delay-locked loop element to receive a master input clock and to generate N clock signals. The clock signals are delay-locked to the master input clock such that the master input clock is divided into N time intervals. The delay-locked loop element may include first and second crossover voltage control inputs. A plurality of pu-pulse generators is included to, based at least in part on the N clock signals and N data signals, generate at least one pu-pulse that turns on at least one pull-up output transistor for a first one of the time intervals. A plurality of pd-pulse generators is included to, based at least in part on the N clock signals and N data signals, generate at least one pd-pulse that turns on at least one pull-down output transistor for a second one of the time intervals. A pulse overlap measurement circuit is included to, based at least in part on an overlap between least one pu-pulse and at least one pd-pulse, generate pulse overlap measurement signal POM. The pulse overlap measurement signal is provided to the first and second crossover voltage control inputs to provide feedback to control and minimize the overlap between at least two pairs of a pu-pulse and a pd-pulse.

This summary is provided to introduce a selection of concepts in a simplified form that are further described below in the detailed description. This summary is not intended to identify key or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

To describe the manner in which the above-recited and other advantages and features can be obtained, a more particular description is set forth and will be rendered by reference to specific examples thereof which are illustrated in the appended drawings. Understanding that these drawings depict only typical examples and are therefore not to be considered limiting in their scope, implementations will be described and explained with additional specificity and detail through the use of the accompanying drawings.

DETAILED DESCRIPTION OF THE EMBODIMENTS

Examples are discussed in detail below. While specific implementations are discussed herein, this is done for illustration purposes only. A person skilled in the relevant art will recognize that other components and configurations may be used without departing from the spirit and scope of the subject matter of this disclosure. The implementations may be a machine-implemented method, a computing device, or an integrated circuit.

In the discussion, unless otherwise stated, adjectives such as "substantially" and "about" modifying a condition or relationship characteristic of a feature or features of an embodiment of the disclosure are understood to mean that the condition or characteristic is defined to be within tolerances that are acceptable for operation of the embodiment for an application for which the embodiment is intended. In addition, the verb "coupled" should be understood to mean directly connected or connected via circuitry and/or wires that do not substantially alter the characteristics of the signals being communicated between two circuits and/or circuit blocks.

High-speed data serialization and transmission circuits may utilize push-pull type output drivers that are controlled by high-speed pulses. Pu-pulses are active low pulses that turn on a pull-up output transistor. Pd-pulses are active high pulses that turn on a pull-down output transistor. If a pu-pulse and a pd-pulse overlap, the respective pull-up and the pull-down output transistors will conduct current at the same time. This in turn can lead to degraded timing, reduced output amplitude, increased crow-bar current, and increased power consumption.

In an embodiment, a feedback system aligns the pu-pulses to the pd-pulses and minimizes their overlap. The feedback system uses integral and proportional feedback loops to control the crossover voltages of the clocks generated by the multi-phase clock generator such that the overlap of the pu-pulses with the pd-pulses is minimized.

Figure 1:
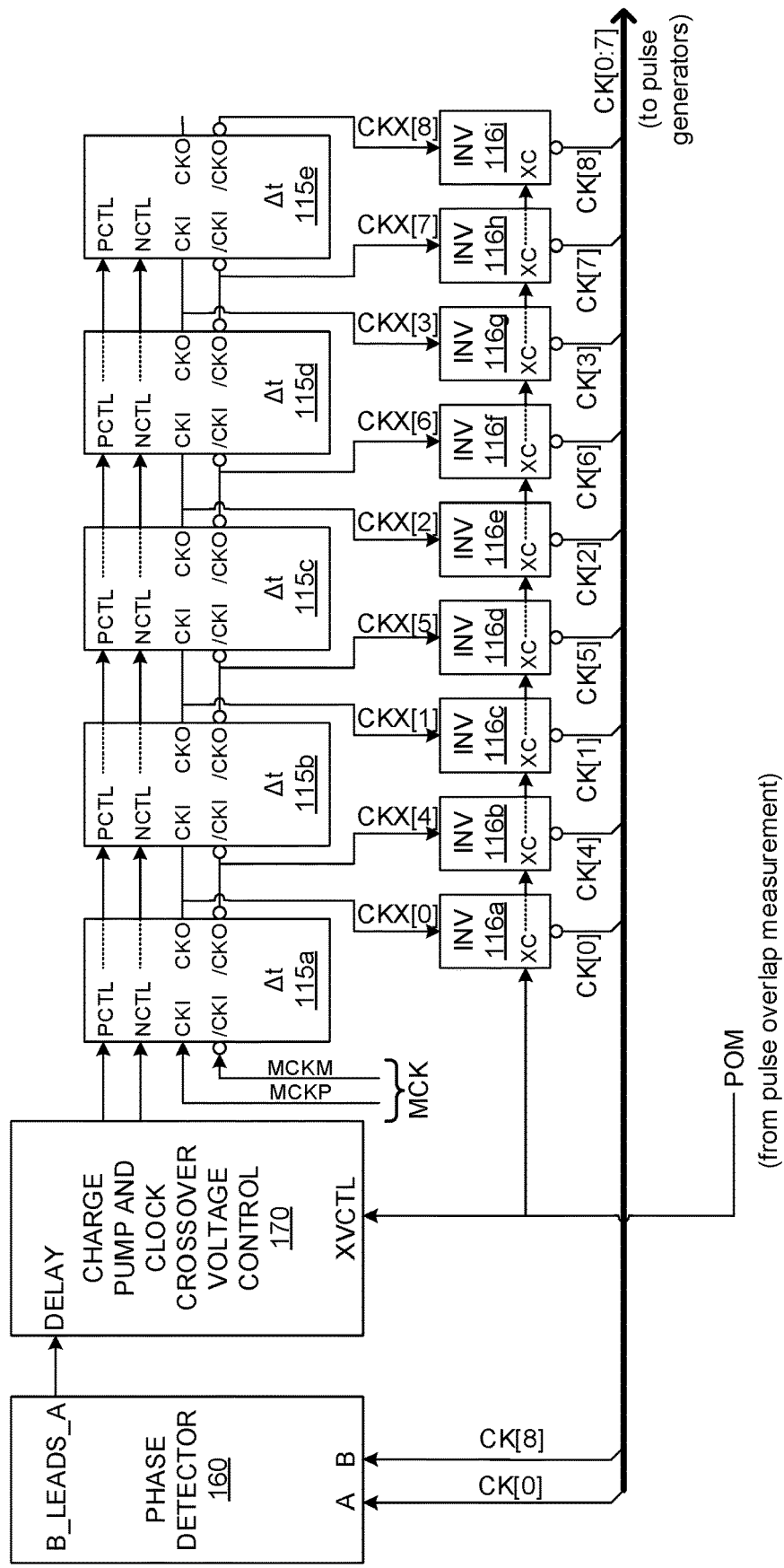
FIG. 1 is a block diagram illustrating a delay-locked loop with output clock crossover voltage control.

FIG. 1 is a block diagram illustrating an example multi-phase clock generator comprising a delay-locked loop element with output clock crossover voltage control. In FIG. 1, delay-locked loop (DLL) 110 includes phase detector 160, charge pump and crossover voltage control circuit 170, delay elements 115a-115e, and output inverters 116a-116i. Delay elements 115a-115e generate precursor clock signals CKX[0:8]. Delay elements 115a-115e receive control signals PCTL and NCTL from charge pump and crossover voltage control circuit 170. Control signals PCTL and NCTL control the delay of signals propagating through each respective delay element 115a-115e and the crossover voltages of each clock signal CKX[0:3] to its respective corresponding opposite-polarity clock CKX[4:7]. Precursor clock signals CKX[0:8] are respectively coupled to output inverters 116a-116i, and output inverters 116-116i respectively generate clock signals CK[0:8]. When a period of time in which each of precursor clock signals CKX[0:7] is high is less than 50% of the period precursor clock signals CKX[0:7], this leads to low crossover voltages of precursor clock signals CKX[0:7] and high crossover voltages of clock signals CK[0:7].

In an embodiment, the loading on the outputs of delay elements 115a-115e may be configured to be substantially equal. For example, an additional delay element (not shown in FIG. 1) may be coupled to the output of delay element 115e, and an additional output inverter may be coupled to the CKO output of delay element 115e. Other ways of equalizing the loading on the outputs of delay elements 115a-115e may also be employed, such as with capacitors and/or dummy transistors.

The outputs of output inverters 116a-116i are coupled to clock signals CK[0:8]. Clock signals CK[0] and CK[8] are coupled to respective inputs A and B of phase detector 160. Phase detector 160 compares CK[0] and CK[8] to generate phase detector output signal B_LEADS_A, and phase detector output signal signal B_LEADS_A is coupled to input DELAY of charge pump and crossover voltage control circuit 170. Charge pump and crossover voltage control circuit 170 also receives pulse overlap measurement signal POM from pulse overlap measurement circuit 320 of FIG. 3 and FIG. 4. Charge pump and crossover voltage control circuit 170 is further described herein with reference to FIG. 10.

The clock signals CK[0:7] are delay-locked to a master differential input clock signal MCK by DLL 110. Clock signal MCK is comprised of master single-ended input clock signals MCKP and MCKM. Desirable performance metrics for clock signals MCKP and MCKM include a 50% duty cycle, rise/fall times and voltage levels that are substantially equal to the rise/fall times and voltage levels of precursor clock signals CKX[0:7], and a 180 degree phase difference between MCKP and MCKM. A feedback loop of DLL 110 includes phase detector 160 and charge pump and crossover voltage control circuit 170. This feedback loop sets the delay of delay elements 115a-115e such that clock signals CK[0:7] transition at times that are regularly spaced over a period of the master input clock signal MCK received at the CKI and /CKI inputs of delay element 115a. In particular, when DLL 110 is locked, rising edges and falling edges of CK[0:7] generated by DLL 110 occur at times that are evenly spaced over the 360° period of the master input clock (which is also the period of clock signals CK[0:7]). For example, if a rising edge of CK[0] as output by DLL 110 is taken to be a 0° reference, then the rising edges of CK[1:7] as output by DLL 110 would be spaced as follows: CK[1] would be at 360°/8; CK[2] would be at 2×360°/8; CK[3] would be at 3×360°/8; CK[4] would be at 4×360°/8; and so on, with CK[7] at 7×360°/8. Similar relative spacing is achieved for falling edges of CK[0:7].

Figure 2:
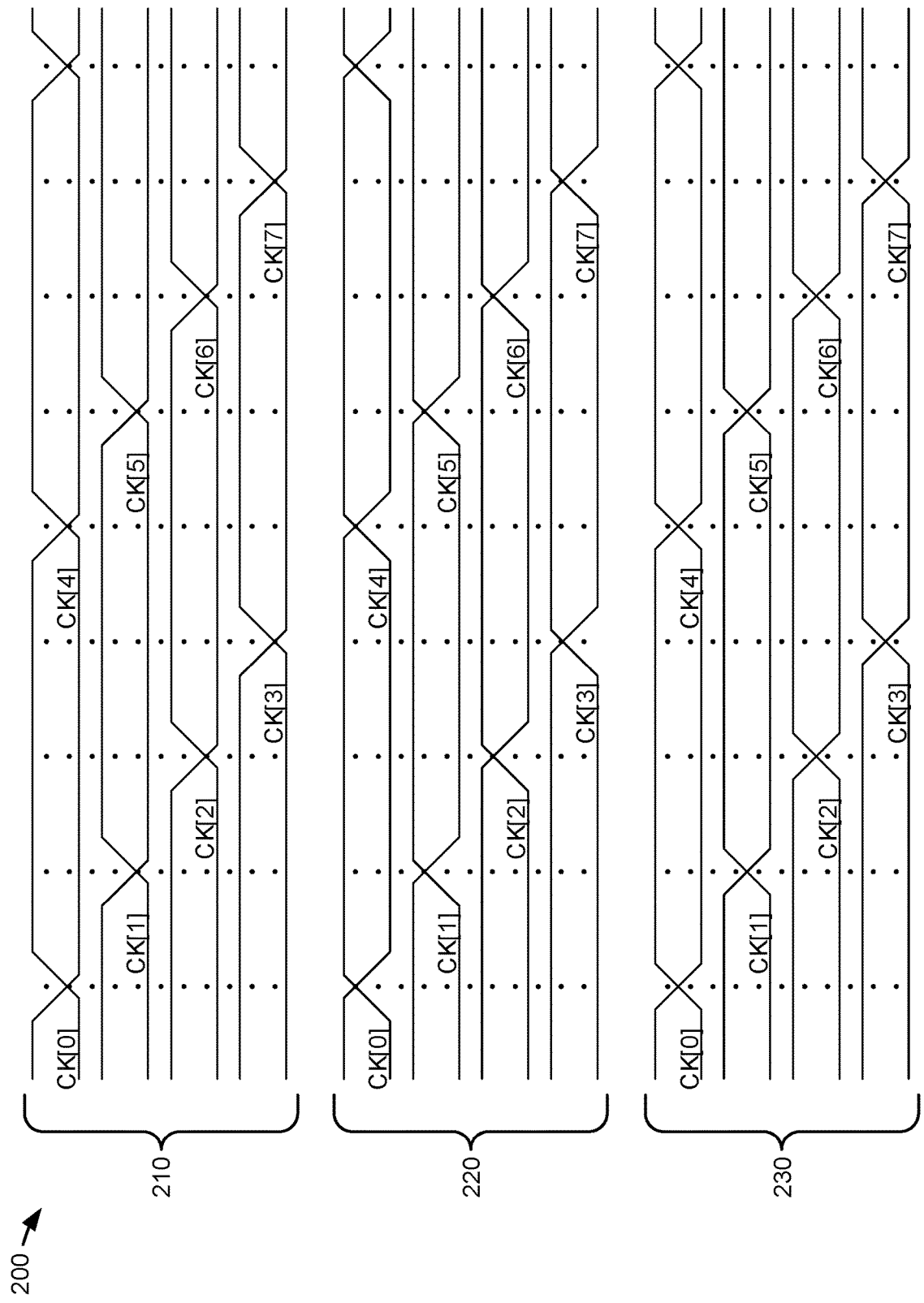
FIG. 2 illustrates CK[0:7] waveforms in accordance with the present invention.

FIG. 2 illustrates CK[0:7] waveforms 200 for the cases of low crossover voltage 210 (rising edges are late relative to falling edges), high crossover voltage 220 (rising edges are early relative to falling edges), and neither high nor low crossover voltage 230 (rising edges are aligned to falling edges). The feedback system minimizes the overlap between pu-pulses and pd-pulses by controlling clock crossover voltage.

Figure 3:
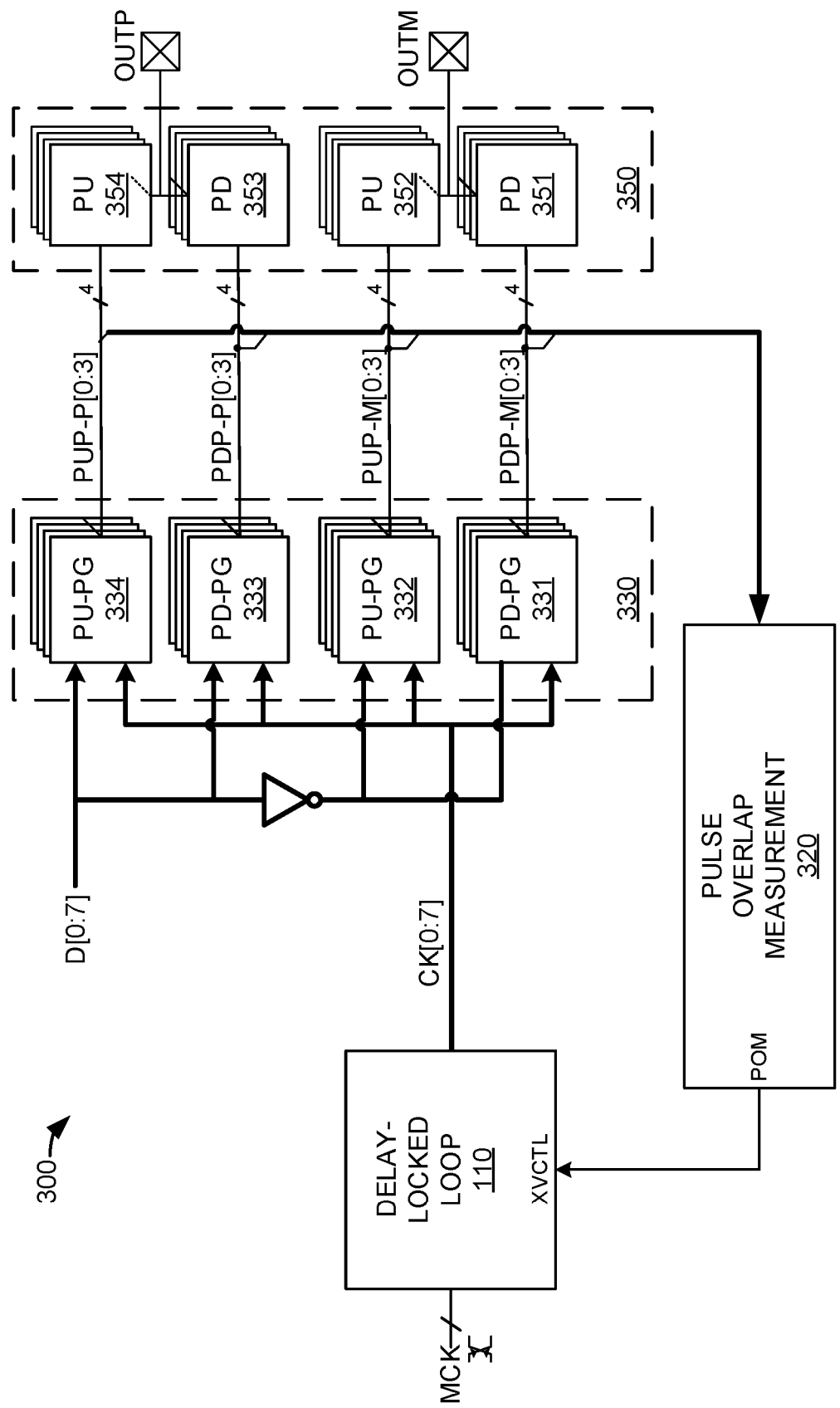
FIG. 3 is a block diagram illustrating a data serializer in accordance with the present invention.

FIG. 3 is a block diagram illustrating example data serializer and pulse overlap control circuit 300. Data serializer 300 includes DLL 110, pulse overlap measurement circuit 320, data-controlled pulse generators 330, and pulse-controlled output drivers 350. DLL 110 generates N clocks, where N equals 8 in this example. Pulse generators 330 may be comprised of M data-controlled pu-pulse generators 334, M data-controlled pd-pulse generators 333, M data-controlled pu-pulse generators 332, and M data-controlled of pd-pulse generators 331, where M may be equal to, for example, 8 or, as in this example, 4. Pulse generators 331-334 each receive at least one corresponding data signal D[0:7] and at least two corresponding clock signals CK[0:7]. Pulse generators 331-334 each conditionally generate, according to the respective value of the data signals D[0:7], corresponding pulses to turn on a corresponding pullup output driver 352, 354 or corresponding pulldown output driver 351, 353. In the illustrated example pulse overlap circuit 300 of FIG. 3, M equals 4, and each data-controlled pulse generator includes a 2:1 multiplexer and receives two corresponding data signals of D[0:7].

The pulses generated by pulse generators 331-334 each have a timing and duration set by the edge timing of a pair of time-adjacent CK[0:7] signals. In one embodiment, the timing of a leading edge of a pu-pulse associated with D[N] (N=0 to 7) is determined by a falling edge of CK[N], and the timing of a trailing edge of a pu-pulse associated with D[N] is determined by a falling edge of CK[N+1] (CK[0] when N+1=8). Similarly, the timing of a leading edge of a pd-pulse associated with D[N] (N=0 to 7) is determined by a rising edge of CK[N], and the timing of a trailing edge of a pu-pulse associated with D[N] is determined by a rising edge of CK[N+1] (CK[0] when N+1=8). This respective dependence of pu-pulse and pd-pulse edge timing on CK[0:7] falling and rising edge timing provides in part for the controllability of the relative timing of pu-pulse and pd-pulses by way of clock CK[0:7] crossover voltage control.

Pulse generators 330 and pulse-controlled output drivers 350 are further described in U.S. Pat. No. 9,525,573, which is hereby incorporated herein by reference for all purposes.

Pd-pulse generators 331 each control a respective one of pulldown output drivers 351, pu-pulse generators 332 each control a respective one of pullup output drivers 352, pd-pulse generators 333 each control a respective one of pulldown output drivers 353, and pu-pulse generators 334 each control a respective one of pullup output drivers 354. The outputs of pulldown output drivers 351 and pull-up output drivers 352 are coupled to a first signal output OUTM. The outputs of pulldown output drivers 353 and pull-up output drivers 354 are coupled to a second signal output OUTP. Together, OUTP and OUTM comprise a differential output data signal.

The output pulses from pulse generators 331-334 are also coupled to pulse overlap measurement circuit 320. Pulse overlap measurement circuit 320 measures overlap of the output pulses and generates pulse overlap measurement signal POM. Pulse overlap measurement signal POM is coupled to crossover voltage control input XVCTL of DLL 110 for the purposes of controlling pulse overlap by controlling CK[0:7] crossover voltage.

Clock signals CK[0:7] from DLL 110 are each provided to respective ones of pd-pulse generators 331, pu-pulse generators 332, pd-pulse generators 333, and pu-pulse generators 334. By means of integral and proportional feedback control, pulse overlap measurement signal POM controls the crossover voltages of clock signals CK[0:7]. The pu-pulses and the pd-pulses are aligned and their overlap minimized by the feedback control. Good stability and good control range are provided in part by the use of both integral and proportional feedback control.

Figure 4:
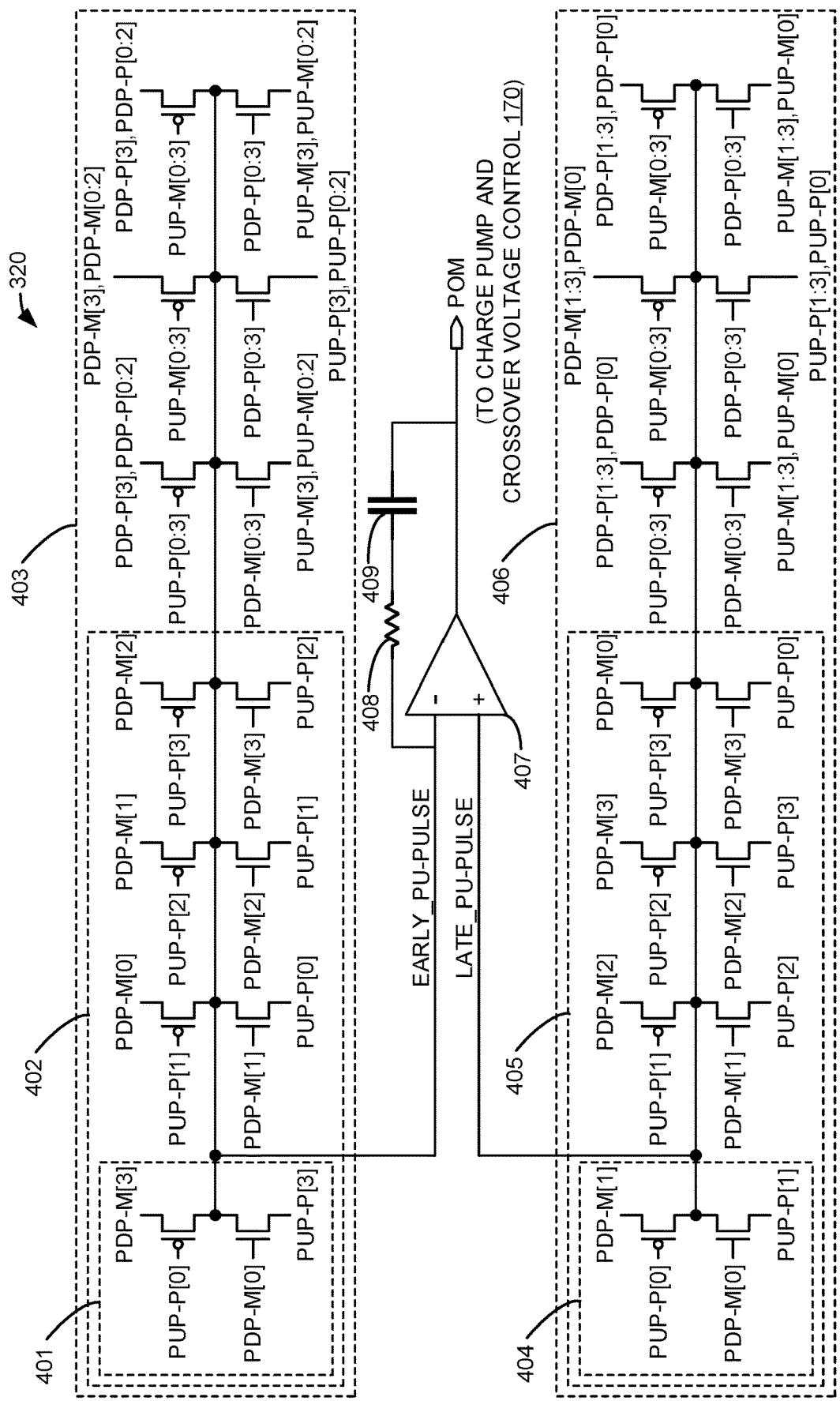
FIG. 4 is an illustration of an example pulse overlap measurement circuit and loop filter.

FIG. 4 illustrates an example pulse overlap measurement circuit 320. Pulse overlap measurement circuit 320 includes early pu-pulse overlap measurement circuit 403, late pu-pulse overlap measurement circuit 406, operation amplifier (op-amp) 407, loop filter resistor 408, and loop filter capacitor 409. The op-amp includes an output coupled to pulse overlap measurement signal POM. The pulse overlap measurement signal POM is coupled to the DLL, as illustrated in FIG. 1 and FIG. 3, for the purpose of controlling DLL clock signals CK[0:7] crossover voltage. An inverting input of op-amp 407 is coupled to an output of early pu-pulse overlap measurement circuit 403, and this coupling is labeled EARLY_PU-PULSE. A non-inverting input of op-amp 407 is coupled to an output of late pu-pulse overlap measurement circuit 406, and this coupling is labeled LATE_PU-PULSE. To provide feedback loop stability, the output of op-amp 407 is coupled to the inverting input of op-amp 407 via series-connected resistor 408 and capacitor 409. In aggregate, op-amp 407 and series-connected resistor 408 and capacitor 409 form a zero-compensated integrating amplifier.

Early pu-pulse overlap measurement circuit 403 of FIG. 4 includes sixteen pairs of transistors. Each transistor pair includes first and second transistors. The first transistor is a PFET and has a source, gate and drain, with the source coupled to a first pd-pulse, the gate coupled to a first time-adjacent pu-pulse that trails the first pd-pulse, and the drain coupled to EARLY_PU-PULSE. The second transistor is an NFET and has a source, gate and drain, with the source coupled to a second pu-pulse, the gate coupled to a time-adjacent pd-pulse that trails the second pu-pulse, and the drain coupled to EARLY_PU-PULSE. Note that pu-pulse and pd-pulse connections are different for each transistor pair and are connected as illustrated in FIG. 4. When the pu-pulses are early relative to the pd-pulses, a voltage on EARLY_PU-PULSE will increase. When the pu-pulses are late relative to the pd-pulses, a voltage on EARLY_PU-PULSE will decrease.

Late pu-pulse overlap measurement circuit 406 of FIG. 4 includes sixteen pairs of transistors. Each transistor pair includes first and second transistors. The first transistor is a PFET and has a source, gate and drain, with the source coupled to a third pd-pulse, the gate coupled to a third time-adjacent pu-pulse that leads the third pd-pulse, and the drain coupled to LATE_PU-PULSE. The second transistor is an NFET and has a source, gate and drain, with the source coupled to a fourth pu-pulse, the gate coupled to a time-adjacent pd-pulse that leads the fourth pu-pulse, and the drain coupled to LATE_PU-PULSE. Note that pu-pulse and pd-pulse connections are different for each transistor pair and are connected as illustrated in FIG. 4. When the pu-pulses are early relative to the pd-pulses, a voltage on LATE_PU-PULSE will decrease. When the pu-pulses are late relative to the pd-pulses, a voltage on LATE_PU-PULSE will increase.

In aggregate response to pulse overlap and signals EARLY_PU-PULSE and LATE_PU-PULSE, when the pu-pulses are early relative to the pd-pulses, a voltage on pulse overlap measurement signal POM will decrease, and when the pu-pulses are late relative to the pd-pulses, the voltage on pulse overlap measurement signal POM will increase. In steady-state, the voltage on pulse overlap measurement signal POM will be constant and the pu-pulses will be substantially aligned to the pd-pulses.

FIGS. 5A-5C and FIGS. 6A-6C illustrate the operation of example pulse overlap measurement subcircuits 401 and 404 for example cases when pu-pulses are early, when pu-pulses are late, and when pu-pulses are in alignment relative to pd-pulses. In FIGS. 5A-5C and FIGS. 6A-6C, primary and secondary charging output currents I1 and I4, and primary and secondary discharging output currents I2 and I3, are generated in response to the described pulse overlap example cases.

Figure 5A:
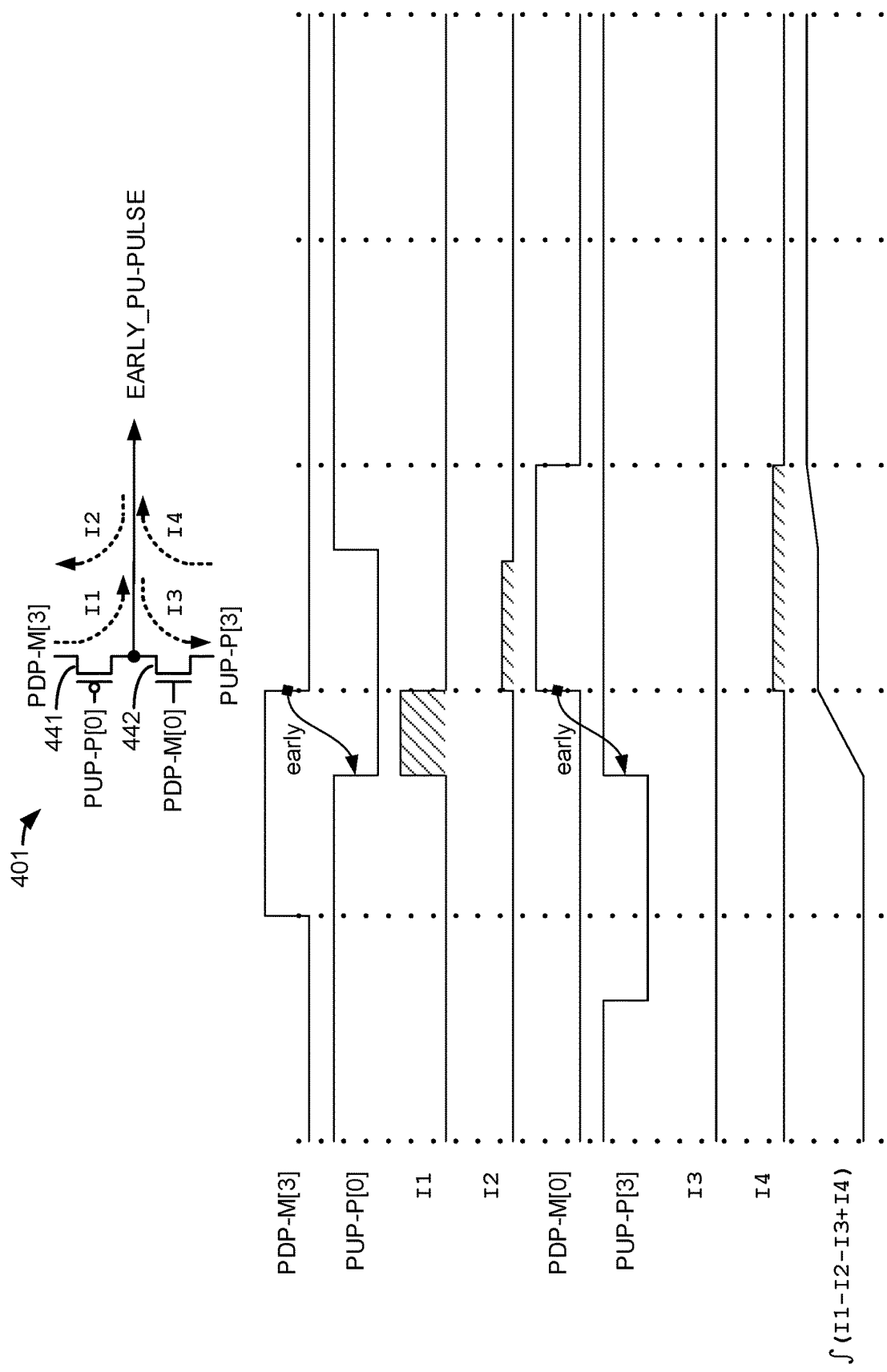
FIGS. 5A-5C are diagrams illustrating the operation of a first example pulse overlap measurement subcircuit when a pu-pulse leads a pd-pulse, when a pu-pulse trails a pd-pulse, and when a pu-pulse is aligned with a pd-pulse.

FIG. 5A illustrates example pulse overlap measurement subcircuit 401 of FIG. 4. Example pulse overlap measurement subcircuit 401 includes PFET 441 and NFET 442, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are early relative to the pd-pulses. Specifically, PUP-P[0] is early relative to PDP-M[3], and because of this, PFET 441 turns on and this leads to a primary charging current I1 onto signal EARLY_PU-PULSE for a duration of time equal to the delay from the assertion (falling edge) of PUP-P[0] to the de-assertion (falling edge) of PDP-M[3], and this in turn contributes to an increase in the voltage of signal EARLY_PU-PULSE and, by the action of op-amp 407, to a corresponding decrease in the voltage of pulse overlap measurement signal POM of FIG. 4. Control loop negative feedback is confirmed by observing that this decrease in the POM (and XVCTL) voltages lead to an increase in crossover voltage of clock signals CK[0:7] and a delay in pu-pulse time position relative to pd-pulse time position, thereby correcting the measured early pu-pulses.

Figure 5B:
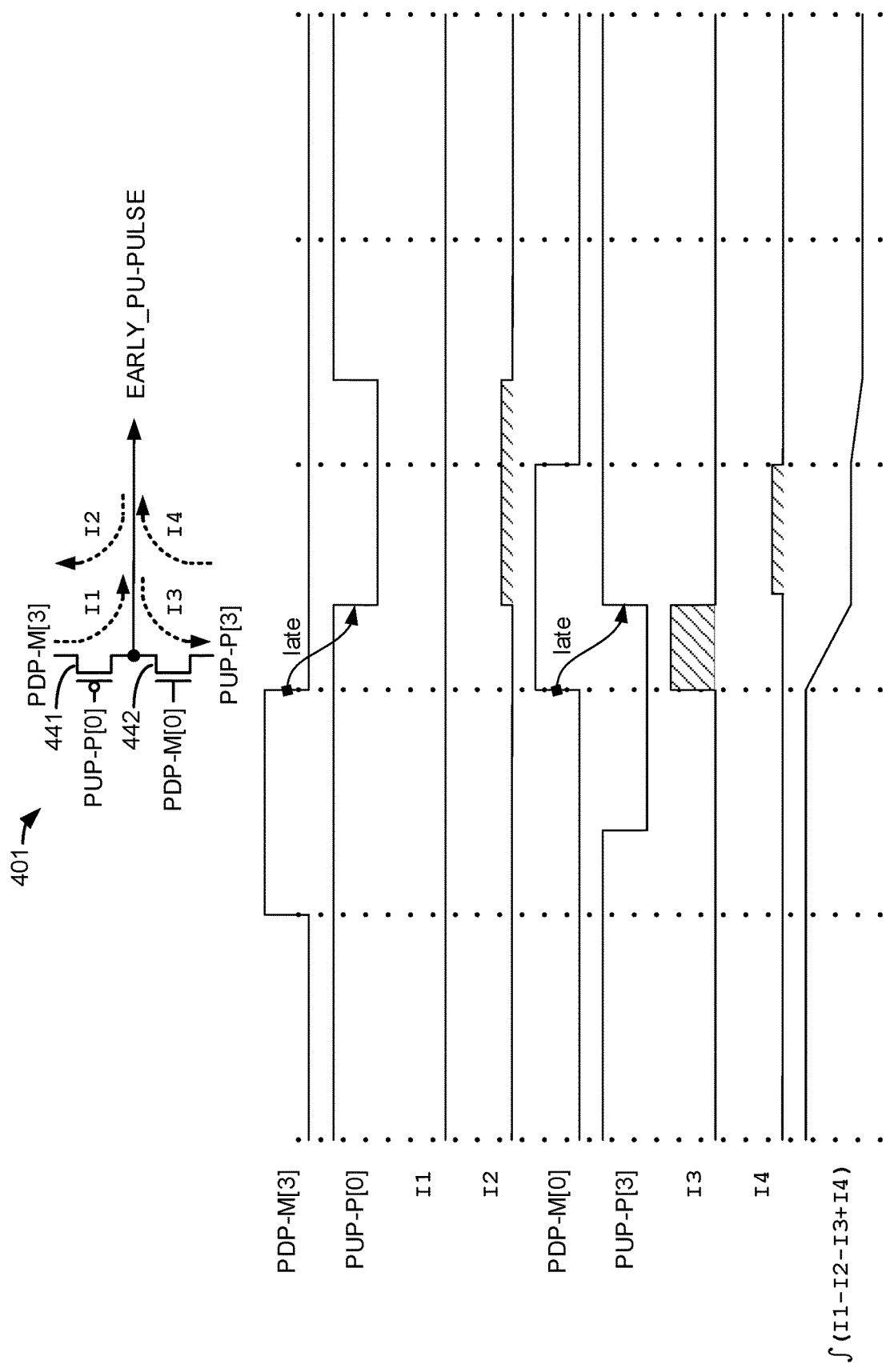

FIG. 5B illustrates example pulse overlap measurement subcircuit 401 of FIG. 4. Example pulse overlap measurement subcircuit 401 includes PFET 441 and NFET 442, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are late relative to the pd-pulses. Specifically, PUP-P[3] is late relative to PDP-M[0], and because of this, NFET 442 turns on and this leads to a primary discharging current I3 from signal EARLY PU-PULSE for a duration of time equal to the delay from the assertion (rising edge) of PDP-M[0] to the de-assertion (rising edge) of PUP-P[3], and this in turn contributes to a decrease in the voltage of signal EARLY PU-PULSE and, by the action of op-amp 407, to a corresponding increase in the voltage of pulse overlap measurement signal POM of FIG. 4.

Figure 5C:
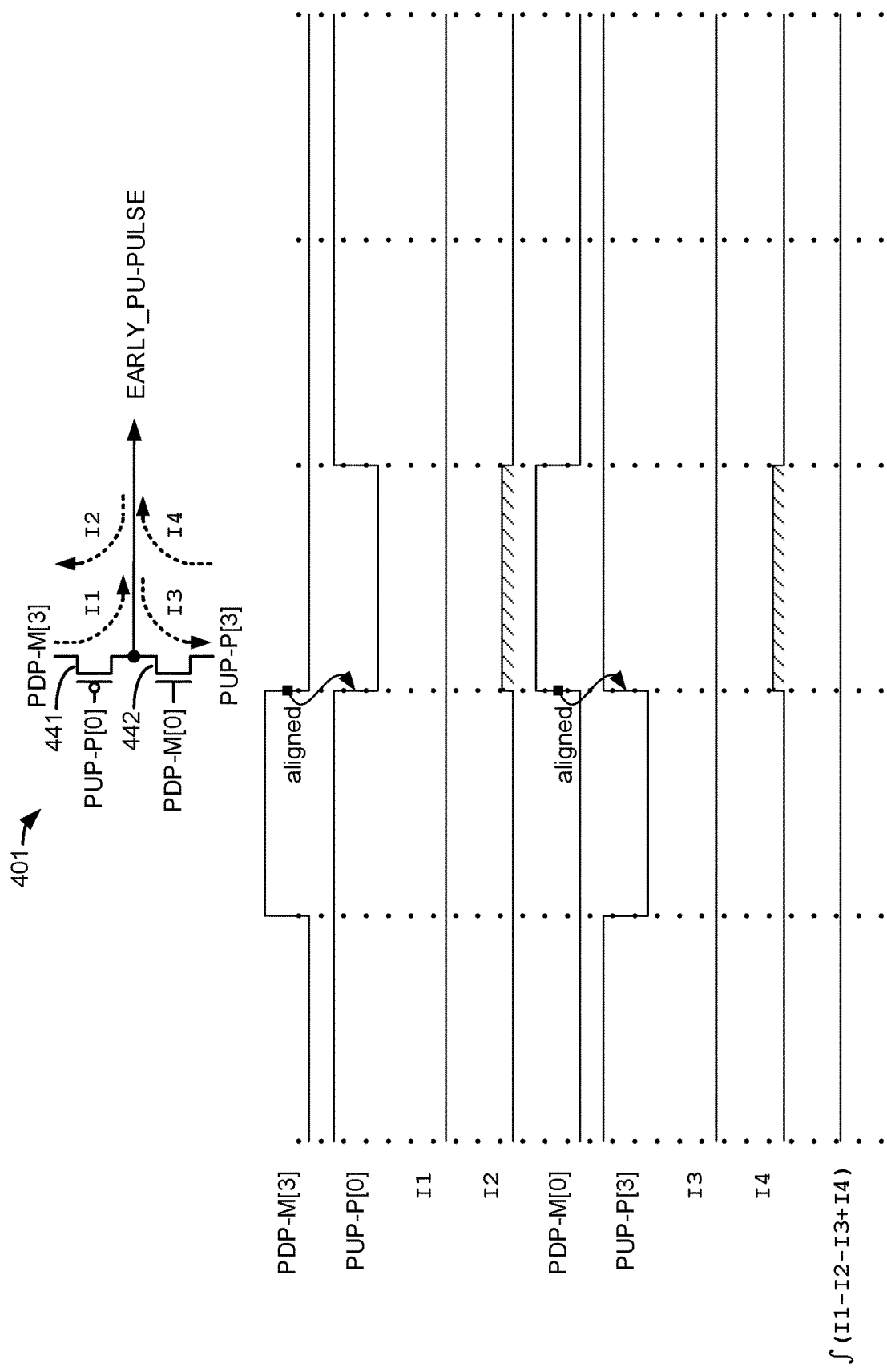

FIG. 5C illustrates example pulse overlap measurement subcircuit 401 of FIG. 4 when operating in steady state. Example pulse overlap measurement subcircuit 401 includes PFET 441 and NFET 442, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are aligned to the pd-pulses. Specifically, the trailing edge of PDP-M[3] is aligned to the leading edge of PUP-P[0], and the leading edge of pulse PDP-M[0] is aligned to the trailing edge of pulse PUP-P[3], and because of this, primary charging and discharging output currents I1 and I3 both equal zero.

Figure 6A:
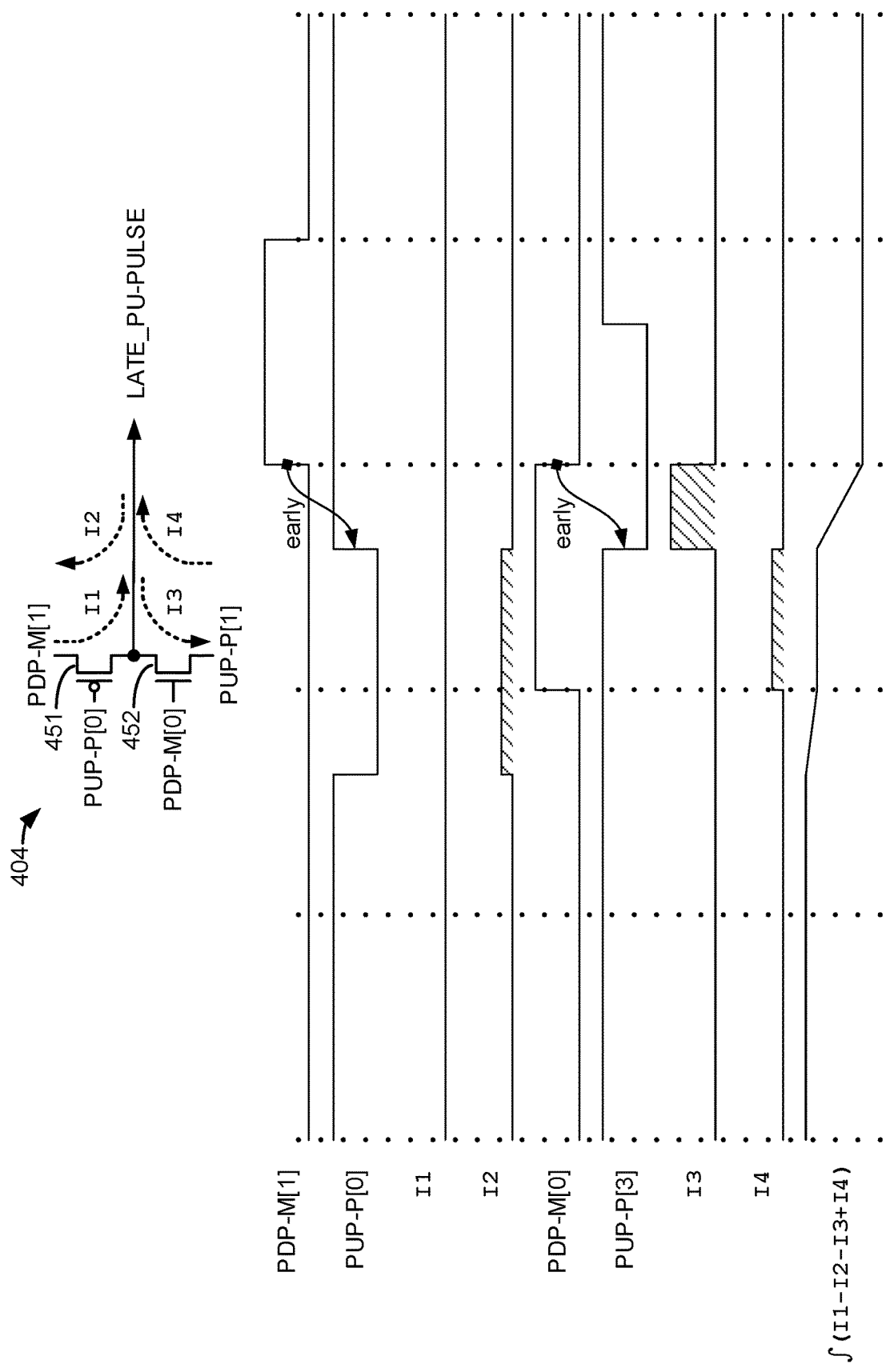
FIGS. 6A-6C are diagrams illustrating the operation of a second example pulse overlap measurement subcircuit when a pu-pulse leads a pd-pulse, when a pu-pulse trails a pd-pulse, and when a pu-pulse is aligned with a pd-pulse.

FIG. 6A illustrates example pulse overlap measurement subcircuit 404 of FIG. 4. Example pulse overlap measurement subcircuit 404 includes PFET 451 and NFET 452, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are early relative to the pd-pulses. Specifically, PUP-P[3] is early relative to PDP-M[0], and because of this, NFET 452 turns on and this leads to a discharge current I3 from signal LATE_PU-PULSE for a duration of time equal to the time delay from the assertion (falling edge) of PUP-P[3] to the de-assertion (falling edge) of PDP-M[0], and this in turn contributes to a decrease in the voltage of signal LATE_PU-PULSE and, by the action of op-amp 407, to a corresponding decrease in the voltage of pulse overlap measurement signal POM of FIG. 4.

Figure 6B:
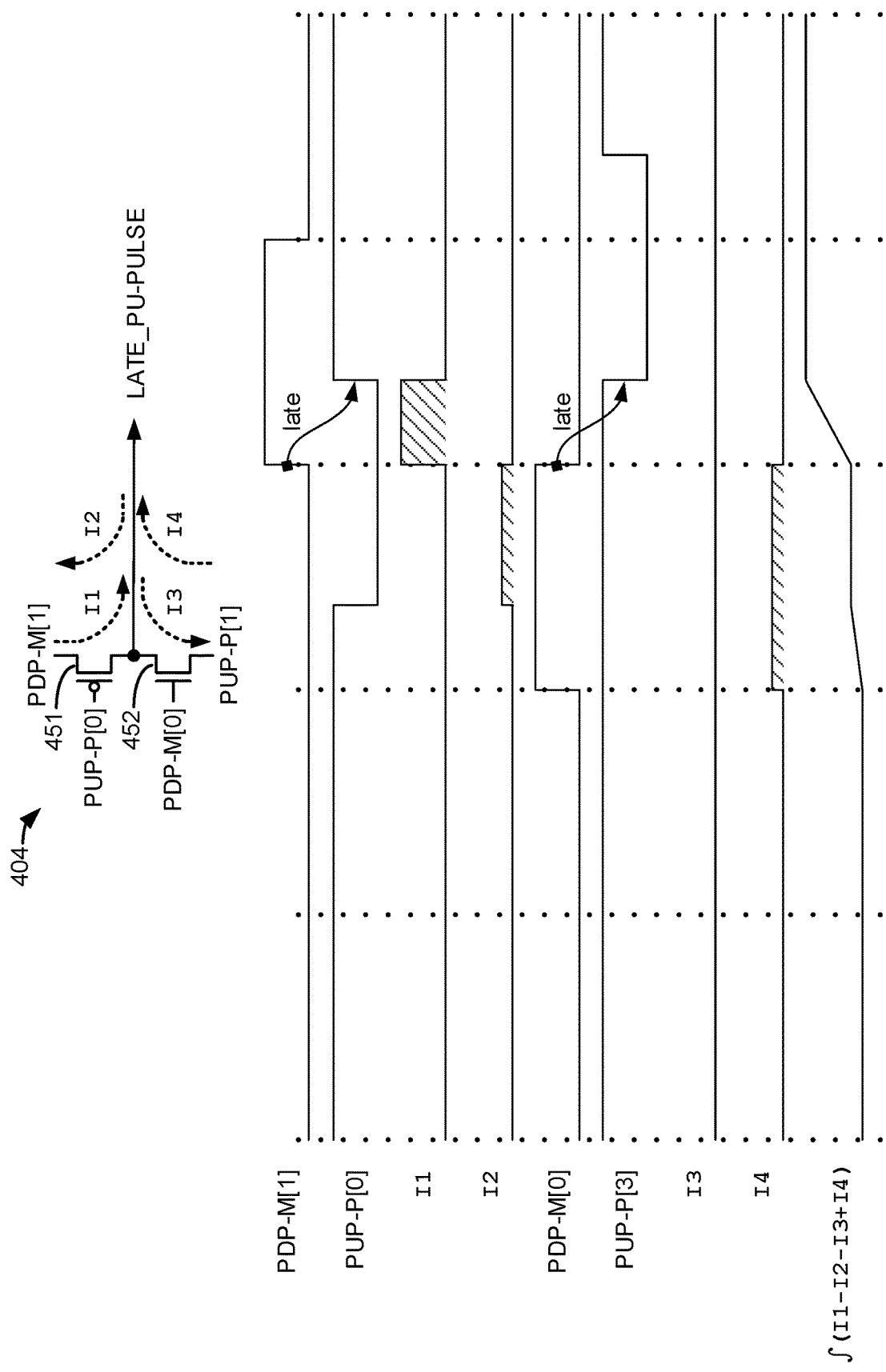

FIG. 6B illustrates example pulse overlap measurement subcircuit 404 of FIG. 4. Example pulse overlap measurement subcircuit 404 includes PFET 451 and NFET 452, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are late relative to the pd-pulses. Specifically, PUP-P[0] is late relative to PDP-M[1], and because of this, PFET 451 turns on and this leads to a charging current I1 onto signal LATE PU-PULSE for a duration of time equal to the time delay from the assertion (rising edge) of PDP-M[1] to the de-assertion (rising edge) of PUP-P[0], and this in turn contributes to an increase in the voltage of signal LATE PU-PULSE and, by the action of op-amp 407, to a corresponding increase in the voltage of pulse overlap measurement signal POM of FIG. 4.

Figure 6C:
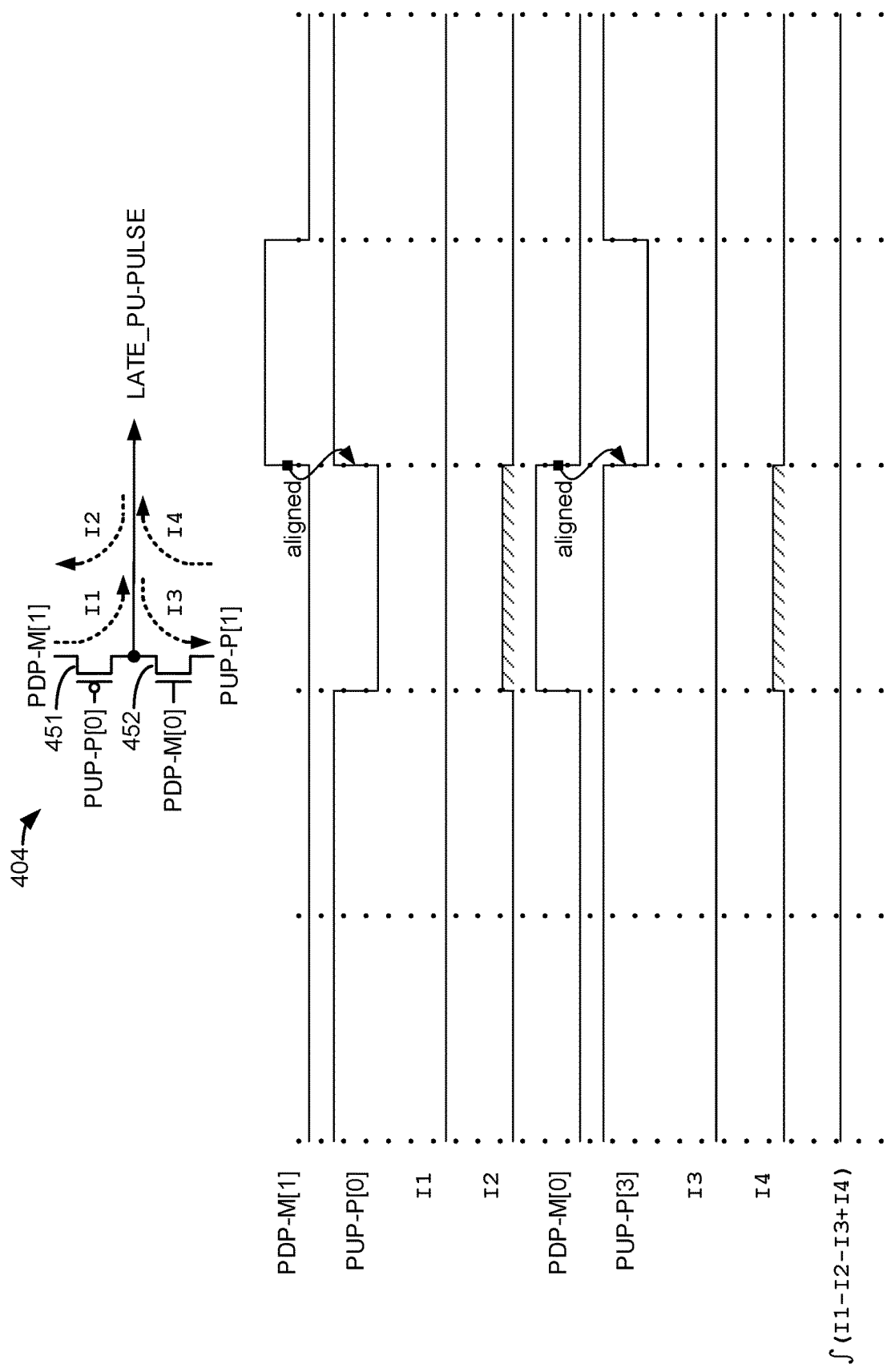

FIG. 6C illustrates example pulse overlap measurement subcircuit 404 of FIG. 3 when operating in steady state. Example pulse overlap measurement subcircuit 404 includes PFET 451 and NFET 452, and is coupled to pu-pulse and pd-pulse signals as drawn. Also illustrated are example pu-pulses and pd-pulses and resulting primary and secondary charging output currents I1 and I4 and primary and secondary discharging output currents I2 and I3 when the pu-pulses are aligned to the pd-pulses. Specifically, the leading edge of PDP-M[1] is aligned to the trailing edge of PUP-P[0], and the trailing edge of pulse PDP-M[0] is aligned with the leading edge of pulse PUP-P[3], and because of this, output currents I1 and I3 both equal zero.

A negative feedback loop drives pulse overlap measurement substantially to zero and can be summarized as follows: A non-zero pulse overlap leads to at least one non-zero primary output current I1 and/or I3 onto and/or from EARLY_PU-PULSE and/or LATE_PU-PULSE. The at least one non-zero primary output current causes a change in POM voltage in response and in proportion to pulse overlap. The change in POM voltage then causes a change in crossover voltage of clock signals CK[0:7]. The change in crossover voltage of clock signals CK[0:7] then causes a change in pulse overlap of opposite polarity to the original non-zero pulse overlap. The described negative feedback loop leads to a reduction in pulse overlap to substantially zero.

The overlap measurement subcircuits also conduct secondary output currents I2 and I4 onto and from EARLY_PU_PULSE and LATE_PU-PULSE, even when the primary output currents I1 and I3 equal zero and the pulse overlap has been reduced to substantially zero. By nature of the design, these secondary currents favorably influence only a common-mode voltage of EARLY_PU_PULSE and LATE_PU-PULSE such that, in steady-state, the common-mode voltage of EARLY_PU_PULSE and LATE_PU-PULSE equals approximately Vdd/2.

Figure 7:
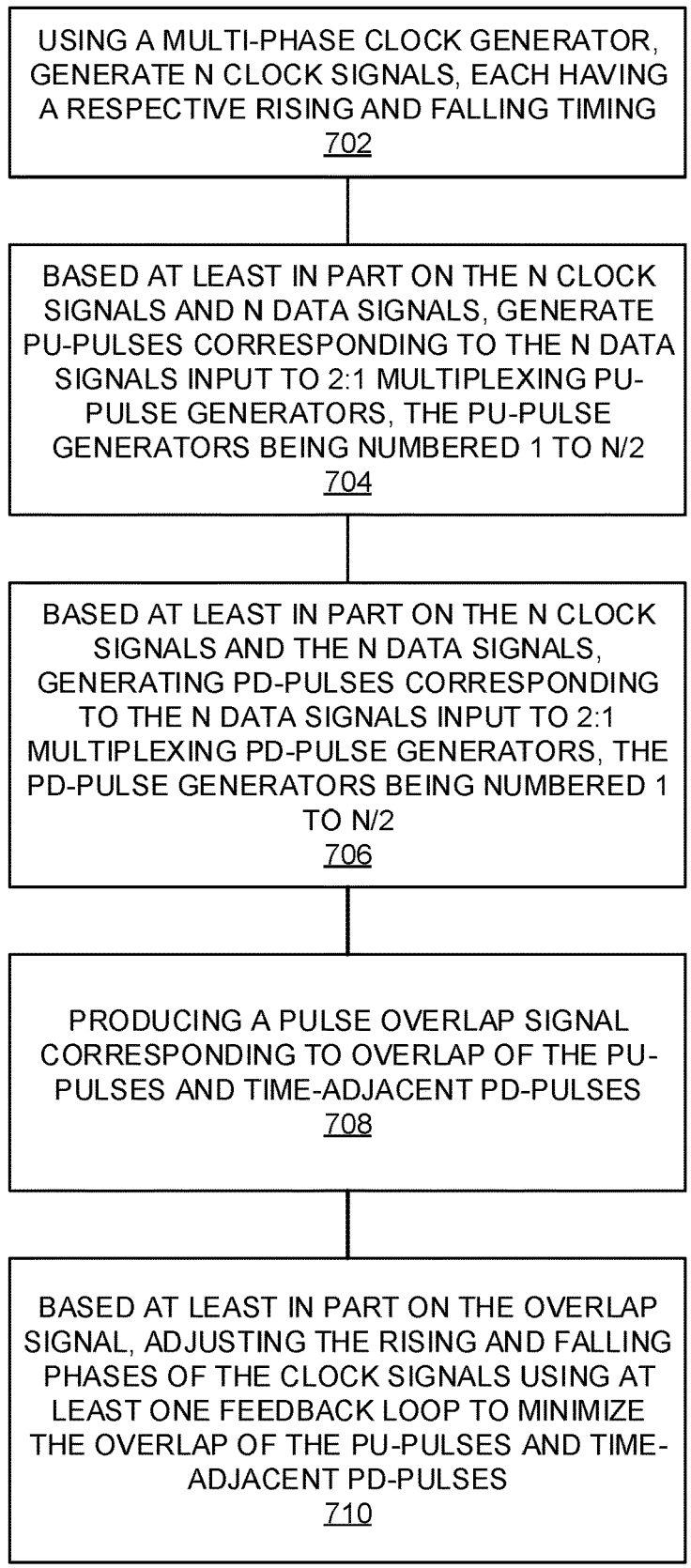
FIG. 7 is a flowchart of a method of aligning pulses.

FIG. 7 is a flowchart of a method of aligning pulses. The steps illustrated in FIG. 7 may be performed by one or more elements of, for example, data serializer and pulse overlap control circuit 300. Using a multi-phase clock generator, generate N clocks signals that each have respective rising and falling phases (702). For example, DLL 110 may generate clock signals CK[0:7] where each of CK[0:7] has a different rising and falling phase. The clock signals CK[0:7] generated by DLL 110 may be delay-locked with a master input clock signal MCK by DLL 110. One or more feedback loops included in DLL 110 may set the delay and/or crossover voltages of delay elements such that the clock signals CK[0:7] each transition at times that are regularly spaced over the period of the master input clock. In an embodiment, when DLL 110 is locked, a given edge (rising or falling) of each of CK[0:7] generated by DLL 110 occur at different times that are evenly spaced over the 360° period of the master input clock (which is also the period of clock signals CK[0:7]).

Based at least in part on the N clock signals and N data signals, pu-pulses corresponding to the M data signals input to pu-pulse generators are generated where the pu-pulse generators are numbered 1 to M (704). For example, M pu-pulse generators 332 and/or M pu-pulse generators 334 can each generate, according to the respective value of the data signal D[0:7], and according to timing that is based on clock signals CK[0:7], corresponding pulses to turn on or leave off, a corresponding pullup output driver 352, 354.

Based at least in part on the N clock signals and N data signals, pd-pulses corresponding to the N data signals input to M pd-pulse generators are generated where the pd-pulse generators are numbered 1 to M (706). For example, M pd-pulse generators 331 and/or M pd-pulse generators 333 can each generate, according to the respective value of the data signal D[0:7], and according to timing that is based on clock signals CK[0:7], corresponding pulses to turn on or leave off a corresponding pullup output driver 351, 353. In a preferred embodiment, M equals N/2 and each pd-pulse and pu-pulse generator includes a 2:1 multiplexer.

A pulse overlap measurement signal POM corresponding to overlap between pu-pulses and pd-pulses is generated (708). For example, pulse overlap measurement circuit 320 may receive the pu-pulses and pd-pulses generated by data-controlled pulse generators 330. Pulse overlap measurement circuit 320 may compare the pd-pulses and pu-pulses to generate the overlap signal that is indicative of whether the pd-pulses and pu-pulses that are time-adjacent are properly aligned (e.g., do not overlap.) Pulse overlap measurement circuit 320 may generate the overlap signal using one or more of, for example, pulse overlap measurement circuit 401, pulse overlap measurement circuit 404, and/or a multi-signal pulse overlap measurement circuit (e.g., pulse overlap measurement circuit 320).

Based at least in part on the overlap signal, the rising and falling timing of the N clock signals are changed using at least one feedback loop to control the overlap between pu-pulses and pd-pulses (710). For example, pulse overlap measurement signal POM generated by pulse overlap measurement circuit 320 may be used as part of a feedback system that includes DLL 110. This feedback system may use a proportional feedback loop and/or an integral feedback loop. The proportional feedback loop can control, for example, the crossover voltages of data signals D[0:7] that are used to generate the pu-pulses and the pd-pulses that drive pulse-controlled output drivers 350. The integral feedback loop can control, for example, the crossover voltages of precursor clock signals CKX[0:7] that are internal to DLL 110. These crossover voltages are controlled by the feedback loops such that the overlap of the pu-pulses and the time-adjacent pd-pulses is minimized.

Figure 8:
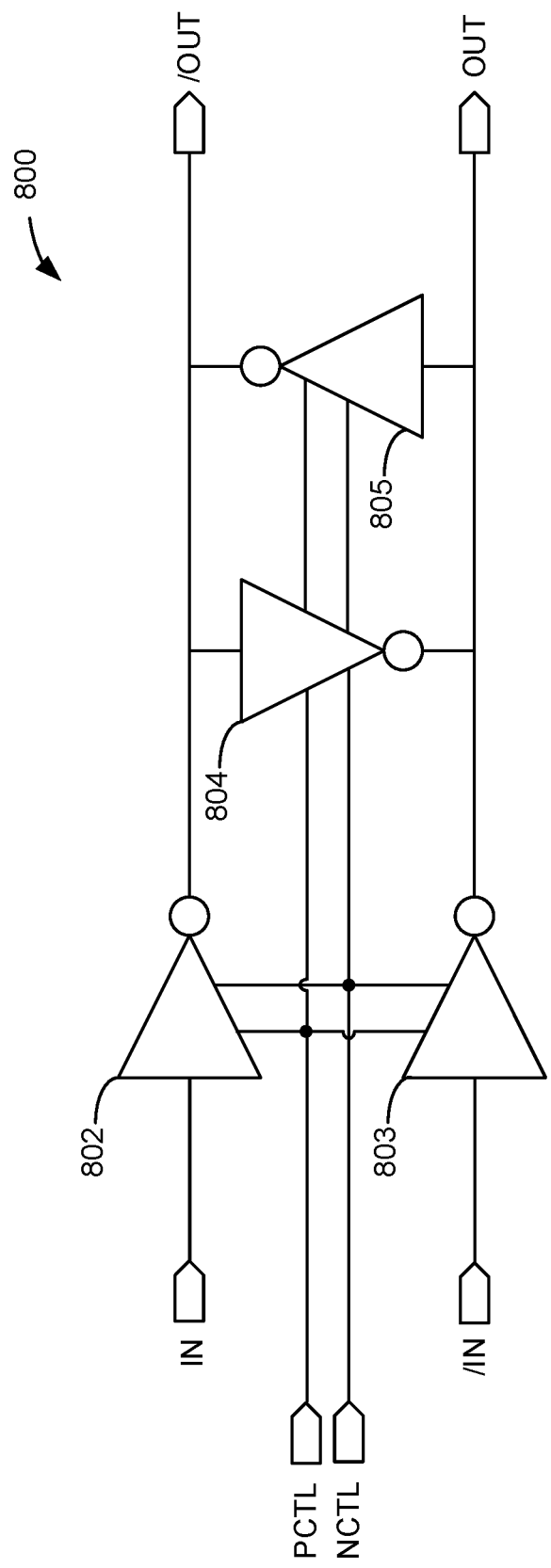
FIG. 8 is a schematic diagram illustrating an example differential voltage-controlled delay circuit.

FIG. 8 is a schematic diagram illustrating an example voltage-controlled delay element 800. Delay element 800 comprises inverter 802, inverter 803, inverter 804, and inverter 805. Delay element 800 is an example of one or more of delay elements 115a-115e of FIG. 1. Inverter 802 receives input signal IN and drives output signal /OUT. Inverter 803 receives input signal /IN and drives output signal OUT. Inverter 804 receives output signal /OUT and drives output signal OUT. Inverter 805 receives output signal OUT and drives output signal /OUT. Each of inverters 802-805 also receives two control signals—NCTL and PCTL. The control signals NCTL and PCTL control the switching time and slew rates of each of the inverters 802-805. Thus, the combination of control signals NCTL and PCTL control the delay of delay element 800. NCTL controls a delay and slew rate of falling transitions of inverters 802-805. PCTL controls a delay and slew rate of rising transitions of inverters 802-805. Thus, NCTL and PCTL are used in combination to control both the delay through delay element 800 and the crossover voltage of OUT and /OUT. In an embodiment, control signals NCTL and PCTL can be one or more analog voltage signals and delay element 800 may be referred to as a voltage-controlled delay cell with output signal crossover control. In another embodiment, control signals NCTL and PCTL can be one or more analog current signals and delay element 800 may be referred to as a current-controlled delay cell with output signal crossover control. In another embodiment, control signals NCTL and PCTL can be one or more digital signals and delay element 800 may be referred to as a digitally-controlled delay cell with output signal crossover control. In yet another embodiment, control signals NCTL and PCTL can be a combination of analog signals and digital signals.

Figure 9:
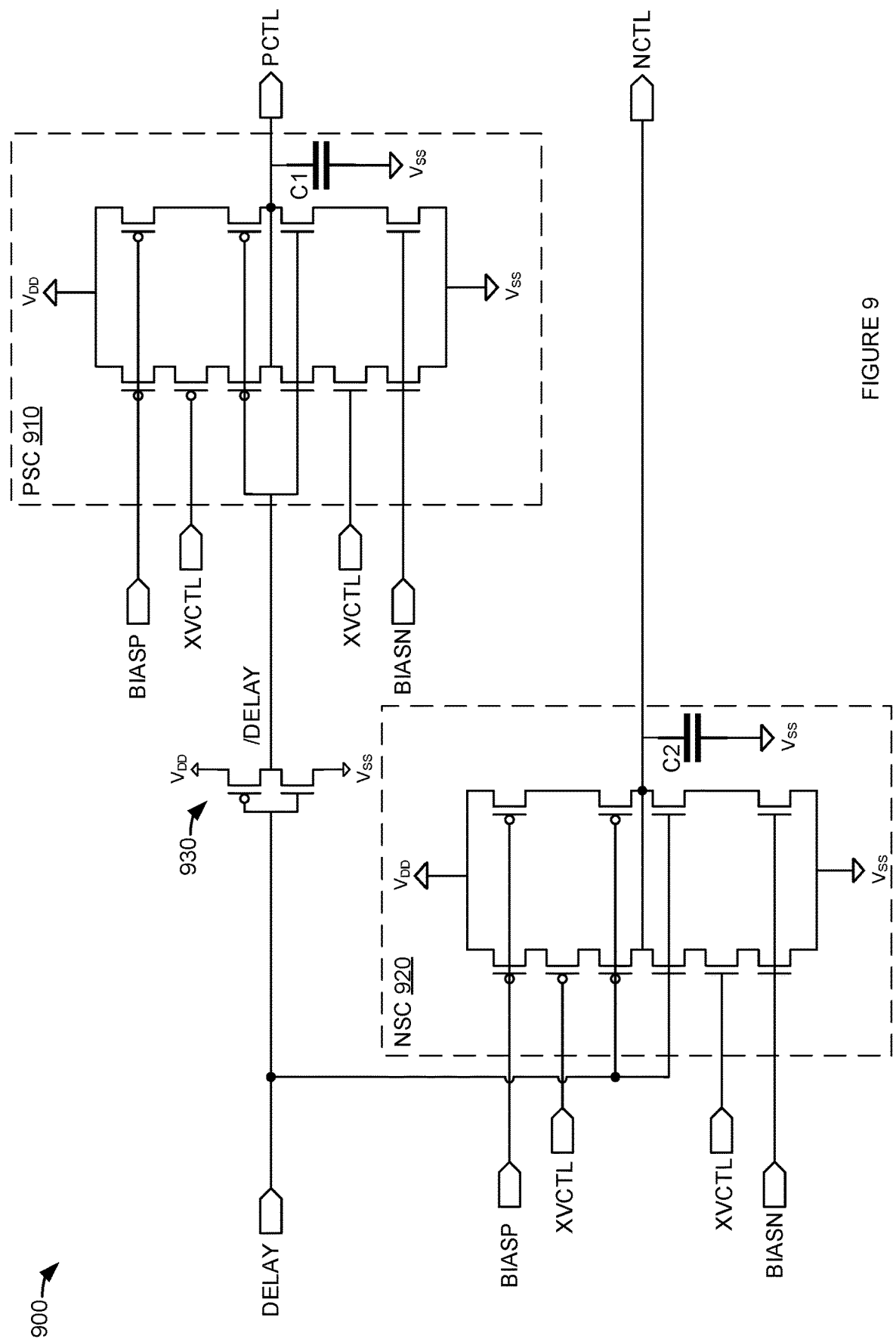
FIG. 9 is an illustration of an example charge pump circuit and filter with crossover voltage control.

FIG. 9 is an illustration of an example charge pump and crossover voltage control circuit. In FIG. 9, charge pump and crossover voltage control circuit 900 comprises PFET slew control (PSC) 910, NFET slew control (NSC) 920, and inverter 930. Control circuit 900 receives control signals DELAY and XVCTL and generates delay cell control signals PCTL and NCTL. PCTL and NCTL may be used to control, for example, the delay and crossover voltages of a voltage-controlled delay line comprised of voltage-controlled delay elements such as delay elements 115a-115e. NSC 920 receives control signal DELAY and generates output signal NCTL. Control signal DELAY may be received from, for example, phase detector 160. Inverter 930 receives DELAY and generates an inverted signal /DELAY. PSC 910 receives control signals /DELAY and XVCTL and generates output signal PCTL. NSC 920 and PSC 910 also receive current source bias voltages BIASP and BIASN. In an embodiment, bias voltages BIASP and BIASN are generated separately by an appropriate bias generator. In another embodiment using self-biasing, BIASP and BIASN are respectively coupled to PCTL and NCTL and appropriate start-up circuits are also included. PSC 910 and NSC 920 also receive crossover voltage control signal XVCTL. In a preferred embodiment, XVCTL is received from output signal POM of pulse overlap measurement circuit 320. Delay cell control signals PCTL and NCTL are respectively filtered by capacitors C1 and C2. In alternative embodiments, XVCTL may be received from alternative phase detector or overlap measurement circuits and/or be generated by the phase detection or overlap measurement of alternative signals (e.g. CK[0:7]).

Figure 10:
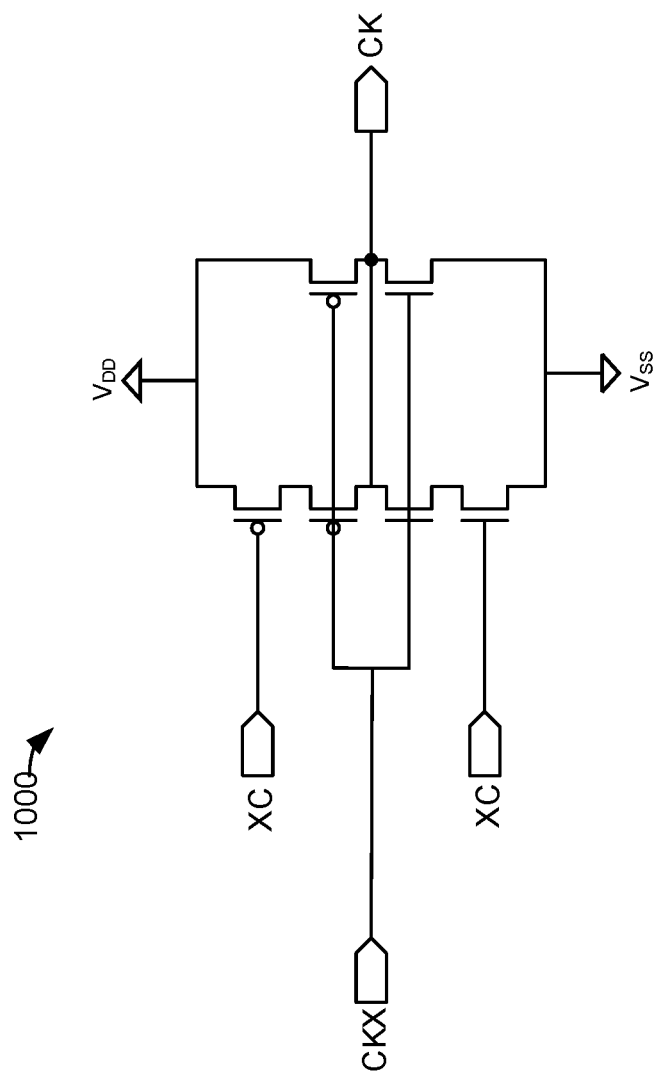
FIG. 10 is an illustration of an example output inverter circuit with crossover voltage control.

FIG. 10 is an illustration of an example output inverter circuit with output signal crossover control. In FIG. 10, output inverter 1000 receives a clock signal CKX and outputs a clock signal CK. Output inverter 1000 is an example of output inverters 116a-116i. Output inverter 1000 also receives output signal crossover control signal XC. XC controls the slew rate of rising and falling edges of CK. In an embodiment, when XC is less than Vdd/2, the rise time of CK will be less (i.e., faster) than the fall time of CK. When XC is greater than Vdd/2, the fall time of CK will be less (i.e., faster) than the rise time of CK. In a preferred embodiment, XC is coupled to output signal POM of pulse overlap measurement circuit 320. In alternative embodiments, XC may be received from alternative phase detector or overlap measurement circuits and/or be generated by the phase detection or overlap measurement of alternative signals (e.g. CK[0:7]).

Implementations discussed herein include, but are not limited to, the following examples:

Example 1

A pulse generation and alignment circuit, comprising: a first set of M clock- and data-controlled pullup pulse (pu-pulse) generators to generate, based at least in part on N clock signals and N data signals, pu-pulses corresponding to the N data signals input to the pu-pulse generators, the pu-pulse generators being numbered 1 to M; a first set of M clock- and data-controlled pulldown pulse (pd-pulse) generators to generate, based at least in part on the N clock signals and the N data signals, pd-pulses corresponding to the N data signals input to the pd-pulse generators, the pd-pulse generators being numbered 1 to M; a pulse overlap measurement circuit to generate a pulse overlap measurement signal corresponding to an overlap between time-adjacent pu-pulses and pd-pulses; a multi-phase clock generator to generate the N clock signals, each having a respective phase; and, a clock cross-over voltage control circuit to, based at least in part on the pulse overlap measurement signal, change the pulse overlap thereby forming at least one feedback loop to control the overlap of the time-adjacent pu-pulses and pd-pulses.

Example 2

The circuit of example 1, wherein the multi-phase clock generator comprises: a plurality of delay elements; a phase detector; and, a charge pump and crossover voltage control circuit.

Example 3

The circuit of example 2, wherein the multi-phase clock generator further comprises: an integrating control input that controls at least one output of the charge pump and crossover voltage control circuit to control the crossover voltages of the N clock signals.

Example 4

The circuit of example 3, the multi-phase clock generator further comprises: a second set of M clock and data-controlled pu-pulse generators to generate, based at least in part on the N clock signals and N complement data signals, pu-pulses corresponding to the N complement data signals input to the pu-pulse generators, the pu-pulse generators being numbered 1 to M; and, a second set of M clock and data-controlled pd-pulse generators to generate, based at least in part on the N clock signals and the N complement data signals, pd-pulses corresponding to the N complement data signals input to the pd-pulse generators, the pd-pulse generators being numbered 1 to M.

Example 5

The circuit of example 2, wherein the multi-phase clock generator further comprises: a proportional control input that controls at least one output of the charge pump and crossover voltage control circuit to control the crossover voltages of the N clock signals.

Example 6

The circuit of example 5, wherein the multi-phase clock generator further comprises: a second set of M clock and data-controlled pu-pulse generators to generate, based at least in part on the N clock signals and N complement data signals, pu-pulses corresponding to the N complement data signals input to the pu-pulse generators, the pu-pulse generators being numbered 1 to M; and, a second set of M clock and data-controlled pd-pulse generators to generate, based at least in part on the N clock signals and the N complement data signals, pd-pulses corresponding to the N complement data signals input to the pd-pulse generators, the pd-pulse generators being numbered 1 to M.

Example 7

The circuit of example 6, wherein the multi-phase clock generator further comprises: an integrating control input that controls at least one output of the charge pump and crossover voltage control circuit to control the crossover voltages of the N clock signals.

Example 8

An integrated circuit, comprising: a delay-locked loop element to receive a master input clock and to generate a set of at least N clock signals, the set of clock signals to be delay-locked to the master input clock such that the master input clock is divided into N time intervals, the delay-locked loop element including a first crossover voltage control input and a second crossover voltage control input; a plurality of pullup-pulse (pu-pulse) generators to, based at least in part on the N clock signals, generate at least one pu-pulse that turns on at least one pull-up output transistor for a first one of the time intervals; a plurality of pulldown-pulse (pd-pulse) generators to, based at least in part on the N clock signals, generate at least one pd-pulse that turns on at least one pull-down output transistor for a second one of the time intervals; and, a pulse overlap measurement circuit to, based at least in part on an overlap between at least one pu-pulse and at least one time-adjacent pd-pulse, generate a pulse overlap measurement signal, the pulse overlap measurement signal to be provided to the first and second crossover voltage control inputs thereby providing a feedback loop to control the overlap between least one pu-pulse and at least one time-adjacent pd-pulse.

Example 9

The integrated circuit of example 8, wherein the delay-locked loop element includes at least N delay elements each having at least one respective delay element output, the first crossover voltage control input to be coupled to the N delay-locked loop elements to control respective delay-element output clock crossover voltages.

Example 10

The integrated circuit of example 9, wherein the delay-locked loop element includes at least N inverter elements that receive the respective delay element outputs to generate the N clock signals, the second crossover voltage control input to be coupled to the N inverter elements to control respective crossover voltages of the N clock signals.

Example 11

The integrated circuit of example 10, wherein the first crossover voltage control input is mixed with an output of a phase detector in the delay-locked loop element to control respective delay-element output crossover voltages and to control a respective delay through each of the N delay-locked loop elements.

Example 12

The integrated circuit of example 11, wherein the output of the phase detector is based at least in part on the relative phases of a subset of the N clock signals.

Example 13

The integrated circuit of example 8, wherein the delay-locked loop element includes at least N inverter elements that generate the N clock signals, the second crossover voltage control input to be coupled to the N inverter elements to control respective crossover voltages of the N clock signals.

Example 14

The integrated circuit of example 13, wherein the delay-locked loop element includes at least N delay elements each having at least one respective delay element output, the first crossover voltage control input to be coupled to the N delay-locked loop elements to control respective delay-element output clock crossover voltages.

Example 15

A method of operating an integrated circuit, comprising: using a multi-phase clock generator, generating N clock signals, each having a respective rising phase and falling phase; based at least in part on the N clock signals and on N data signals, generating pullup-pulses (pu-pulses) corresponding to the N data signals, the pu-pulse generators being numbered 1 to M; based at least in part on the N clock signals and the N data signals, generating pulldown-pulses (pd-pulses) corresponding to the N data signals, the pd-pulse generators being numbered 1 to M; producing an overlap measurement signal corresponding to overlap between time-adjacent pu-pulses and pd-pulses; and, based at least in part on the overlap measurement signal, changing timings of the respective phases using at least one feedback loop to control and reduce the overlap between time-adjacent pu-pulses and pd-pulses.

Example 16

The method of example 15, wherein the at least one feedback loop includes an integral feedback term to control rise times and fall times of a plurality of delay elements within the multi-phase clock generator.

Example 17

The method of example 16, wherein the at least one feedback loop includes a proportional feedback term to control rise times and fall times of a plurality of delay elements within the multi-phase clock generator.

Example 18

The method of example 16, further comprising: based at least in part on the overlap measurement signal, controlling at least one crossover voltage of at least one output of an inverter element of a plurality of inverter elements that generate the N clock signals.

Example 19

The method of example 15, wherein the at least one feedback loop includes a proportional feedback term to control rise times and fall times of a plurality of delay elements within the multi-phase clock generator.

Example 20

The method of example 19, wherein the at least one feedback loop includes an integral feedback term to control rise times and fall times of a plurality of delay elements within the multi-phase clock generator.

The foregoing descriptions of the disclosed embodiments have been presented for purposes of illustration and description. They are not intended to be exhaustive or to limit the scope of the claimed subject matter to the precise form(s) disclosed, and other modifications and variations may be apparent from the above teachings. The embodiments were chosen and described to best explain the principles of the disclosed embodiments and their practical application to thereby enable others skilled in the art to best utilize the various embodiments and various modifications as are suited to the use contemplated. It is intended that the appended claims be construed to include other alternative embodiments except insofar as limited by the prior art.

What is claimed is:

1. A pulse generation and alignment circuit, comprising:
   a first set of M clock- and data-controlled pullup pulse (pu-pulse) generators to generate, based at least in part on N clock signals and N data signals, pu-pulses corresponding to the N data signals input to the pu-pulse generators, the pu-pulse generators being numbered 1 to M;
   a first set of M clock- and data-controlled pulldown pulse (pd-pulse) generators to generate, based at least in part on the N clock signals and the N data signals, pd-pulses corresponding to the N data signals input to the pd-pulse generators, the pd-pulse generators being numbered 1 to M;
   a pulse overlap measurement circuit to generate a pulse overlap measurement signal corresponding to an overlap between time-adjacent pu-pulses and pd-pulses; and
   a multi-phase clock generator to generate the N clock signals, each having a respective phase, the multi-phase clock generator comprising a delay-locked loop having a plurality of delay elements, a phase detector, and
   a charge pump and cross-over voltage control circuit to, based at least in part on the pulse overlap measurement signal, change the pulse overlap thereby forming at least one feedback loop to control the overlap of the time-adjacent pu-pulses and pd-pulses.

2. The circuit of claim 1, wherein the multi-phase clock generator further comprises:
   an integral control input that controls at least one output of the charge pump and cross-over voltage control circuit to control the crossover voltages of the N clock signals.

3. The circuit of claim 2, wherein the multi-phase clock generator further comprises:
   a second set of M clock and data-controlled pu-pulse generators to generate, based at least in part on the N clock signals and N complement data signals, pu-pulses corresponding to the N complement data signals input to the pu-pulse generators, the pu-pulse generators being numbered 1 to M; and,
   a second set of M clock and data-controlled pd-pulse generators to generate, based at least in part on the N clock signals and the N complement data signals, pd-pulses corresponding to the N complement data signals input to the pd-pulse generators, the pd-pulse generators being numbered 1 to M.

4. The circuit of claim 1, wherein the multi-phase clock generator further comprises:
   a proportional control input that controls at least one output of the charge pump and cross-over voltage control circuit to control the crossover voltages of the N clock signals.

5. The circuit of claim 4, wherein the multi-phase clock generator further comprises:
   a second set of M clock and data-controlled pu-pulse generators to generate, based at least in part on the N clock signals and N complement data signals, pu-pulses corresponding to the N complement data signals input to the pu-pulse generators, the pu-pulse generators being numbered 1 to M; and, a second set of M clock and data-controlled pd-pulse generators to generate, based at least in part on the N clock signals and the N complement data signals, pd-pulses corresponding to the N complement data signals input to the pd-pulse generators, the pd-pulse generators being numbered 1 to M.

6. The circuit of claim 5, wherein the multi-phase clock generator further comprises:
an integral control input that controls at least one output of the charge pump and cross-over voltage control circuit to control the crossover voltages of the N clock signals.

7. An integrated circuit, comprising:
a delay-locked loop element comprising a phase detector, a plurality of delay elements, and a charge pump and cross-over voltage control circuit, the delay-locked loop element to receive a master input clock and to generate a set of at least N clock signals, the set of clock signals to be delay-locked to the master input clock such that the master input clock is divided into N time intervals, the delay-locked loop element including a first crossover voltage control input and a second crossover voltage control input;
a plurality of pullup-pulse (pu-pulse) generators to, based at least in part on the N clock signals, generate at least one pu-pulse that turns on at least one pull-up output transistor for a first one of the time intervals;
a plurality of pulldown-pulse (pd-pulse) generators to, based at least in part on the N clock signals, generate at least one pd-pulse that turns on at least one pull-down output transistor for a second one of the time intervals; and,
a pulse overlap measurement circuit to, based at least in part on an overlap between at least one pu-pulse and at least one time-adjacent pd-pulse, generate a pulse overlap measurement signal, the pulse overlap measurement signal to be provided to the first and second crossover voltage control inputs thereby providing a feedback loop to control the overlap between at least one pu-pulse and at least one time-adjacent pd-pulse.

8. The integrated circuit of claim 7, wherein the plurality of delay elements includes at least 1+N/2 differential delay elements each having at least one respective delay element output, the first crossover voltage control input to be coupled to the delay elements to control respective delay-element output clock signal crossover voltages.

9. The integrated circuit of claim 8, wherein the delay-locked loop element includes at least N inverter elements that receive the respective delay element outputs to generate the N clock signals, the second crossover voltage control input to be coupled to the N inverter elements to control respective crossover voltages of the N clock signals.

10. The integrated circuit of claim 9, wherein the first crossover voltage control input is mixed with an output of a phase detector in the delay-locked loop element to control respective delay-element output crossover voltages and to control a respective delay through each of the delay elements.

11. The integrated circuit of claim 10, wherein the output of the phase detector is based at least in part on the relative phases of a subset of the N clock signals.

12. The integrated circuit of claim 7, wherein the delay-locked loop element includes at least N inverter elements that generate the N clock signals, the second crossover voltage control input to be coupled to the N inverter elements to control respective crossover voltages of the N clock signals.

13. The integrated circuit of claim 12, wherein the delay-locked loop element includes at least 1+N/2 differential delay elements each having at least one respective delay element output, the first crossover voltage control input to be coupled to the delay elements to control respective delay-element output clock crossover voltages.

14. A method of operating an integrated circuit, comprising:
using a multi-phase clock generator, generating N clock signals, each having a respective rising phase and falling phase, the multi-phase clock generator comprising a delay-locked loop having a plurality of delay elements, a phase detector, and a charge pump and cross-over voltage control circuit;
based at least in part on the N clock signals and on N data signals, generating pullup-pulses (pu-pulses) corresponding to the N data signals, the pu-pulse generators being numbered 1 to M;
based at least in part on the N clock signals and the N data signals, generating pulldown-pulses (pd-pulses) corresponding to the N data signals, the pd-pulse generators being numbered 1 to M;
producing an overlap measurement signal corresponding to overlap between time-adjacent pu-pulses and pd-pulses; and,
based at least in part on the overlap measurement signal, changing timings of the respective phases using at least one feedback loop to control and reduce the overlap between time-adjacent pu-pulses and pd-pulses.

15. The method of claim 14, wherein the at least one feedback loop includes an integral feedback term to control rise times and fall times of the plurality of delay elements within the multi-phase clock generator.

16. The method of claim 15, wherein the at least one feedback loop includes a proportional feedback term to control rise times and fall times of a plurality of inverter elements within the multi-phase clock generator.

17. The method of claim 15, further comprising:
based at least in part on the overlap measurement signal, controlling at least one crossover voltage of at least one output of an inverter element of a plurality of inverter elements that generate the N clock signals.

18. The method of claim 14, wherein the at least one feedback loop includes a proportional feedback term to control rise times and fall times of a plurality of inverter elements within the multi-phase clock generator.

19. The method of claim 18, wherein the at least one feedback loop includes an integral feedback term to control rise times and fall times of the plurality of delay elements within the multi-phase clock generator.

* * * * *